United States Patent
Chen et al.

(10) Patent No.: US 9,690,278 B1
(45) Date of Patent: Jun. 27, 2017

(54) METHOD AND APPARATUS FOR HIGH-LEVEL PROGRAMS WITH GENERAL CONTROL FLOW

(71) Applicant: Altera Corporation, San Jose, CA (US)

(72) Inventors: Doris Chen, Toronto (CA); Deshanand Singh, Toronto (CA)

(73) Assignee: Altera Corporation, San Jose, CA (US)

( * ) Notice: Subject to any disclaimer, the term of this patent is extended or adjusted under 35 U.S.C. 154(b) by 556 days.

(21) Appl. No.: 14/249,939

(22) Filed: Apr. 10, 2014

(51) Int. Cl.
  *G05B 19/042* (2006.01)
  *H04L 12/933* (2013.01)
  *H04L 12/947* (2013.01)

(52) U.S. Cl.
  CPC .......... *G05B 19/0423* (2013.01); *H04L 49/10* (2013.01); *H04L 49/25* (2013.01)

(58) Field of Classification Search
  CPC ... H04L 9/10; H04L 9/25; H04L 49/10; H04L 49/25
  See application file for complete search history.

(56) References Cited

U.S. PATENT DOCUMENTS 8,677,306 B1 * 3/2014 Andreev ............... G06F 11/267
  714/30

* cited by examiner

*Primary Examiner* — Zachary K Huson
(74) *Attorney, Agent, or Firm* — Fletcher Yoder, P.C.

(57) ABSTRACT

A method of configuring a programmable integrated circuit device to implement control flow at a current basic block. A branch selector node within the current basic block is configured to receive at least one control signal, where each of the at least one control signal is associated with a respective previous basic block. The branch selector node is further configured to select one of the at least one control signal based on one or more intended destinations for the at least one control signal, and provide the selected control signal to a data selector node within the current basic block. The data selector node is configured to select a data signal based on the selected control signal, where the selected data signal is from the respective previous basic block that is associated with the selected control signal.

20 Claims, 13 Drawing Sheets

METHOD AND APPARATUS FOR HIGH-LEVEL PROGRAMS WITH GENERAL CONTROL FLOW

FIELD OF THE INVENTION

This invention relates to the use of a high-level language to configure a programmable integrated circuit devices such as a field-programmable gate array (FPGAs) or other types of programmable logic devices (PLDs).

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

At some point, such devices began to be provided with embedded blocks of random access memory that could be configured by the user to act as random access memory, read-only memory, or logic (such as P-TERM logic). Moreover, as programmable devices have become larger, it has become more common to add dedicated circuits on the programmable devices for various commonly-used functions. Such dedicated circuits could include phase-locked loops or delay-locked loops for clock generation, as well as various circuits for various mathematical operations such as addition or multiplication. This spares users from having to create equivalent circuits by configuring the available general-purpose programmable logic.

While it may have been possible to configure the earliest programmable logic devices manually, simply by determining mentally where various elements should be laid out, it was common even in connection with such earlier devices to provide programming software that allowed a user to lay out logic as desired and then translate that logic into a configuration for the programmable device. With current larger devices, including those with the aforementioned dedicated circuitry, it would be impractical to attempt to lay out the logic without such software. Such software also now commonly includes pre-defined functions, commonly referred to as "cores," for configuring certain commonly-used structures, and particularly for configuring circuits for mathematical operations incorporating the aforementioned dedicated circuits. For example, cores may be provided for various trigonometric or algebraic functions.

Although available programming software allows users to implement almost any desired logic design within the capabilities of the device being programmed, most such software requires knowledge of hardware description languages such as VHDL or Verilog. However, many potential users of programmable devices are not well-versed in hardware description languages and may prefer to program devices using a higher-level programming language.

SUMMARY OF THE INVENTION

One high-level programming language that may be adopted for configuring a programmable device is OpenCL (Open Computing Language), although use of other high-level languages, and particularly other high-level synthesis languages, including C, C++, Fortran, C#, F#, BlueSpec and Matlab, also is within the scope of this invention.

In OpenCL, computation is performed using a combination of a host and kernels, where the host is responsible for input/output (I/O) and setup tasks, and kernels perform computation on independent inputs. Where there is explicit declaration of a kernel, and each set of elements to be processed is known to be independent, each kernel can be implemented as a high-performance hardware circuit. Based on the amount of space available on a programmable device such as an FPGA, the kernel may be replicated to improve performance of an application.

A kernel compiler converts a kernel into a hardware circuit, implementing an application from an OpenCL description, through hardware generation, system integration, and interfacing with a host computer. Therefore, in accordance with embodiments of the present invention, systems and methods for configuring a programmable integrated circuit device to implement control flow at a current basic block. A branch selector node within the current basic block is configured to receive at least one control signal, wherein each of the at least one control signal is associated with a respective previous basic block. The branch selector node is further configured to select one of the at least one control signal based on one or more intended destinations for the at least one control signal, and provide the selected control signal to a data selector node within the current basic block. The data selector node is configured to select a data signal based on the selected control signal, where the selected data signal is from the respective previous basic block that is associated with the selected control signal.

In some embodiments, a respective logic node for each respective previous basic block is configured to transmit each of the at least one control signal to the branch selector node. At least one of the branch selector node and the data selector node may be configured as one or more multiplexers. The selected data signal may be a variable value, and the variable value may be an index variable or a result variable for a loop such as a for loop.

Each of the respective previous basic blocks may be configured to include circuitry for providing completion signals that indicate when processing in each of the respective previous basic blocks is complete. For example, one or more AND gates may be used to provide the completion signals. The one or more intended destinations for the at least one control signal may be indicated using predicate signals. The data selector node may select the data signal by filtering a plurality of incoming data signals based on the selected control signal. The data selector node may be further configured to include a plurality of buffers that temporally align a plurality of incoming data signals and a plurality of predicate signals. Each of the current basic block and the respective previous basic blocks may be configured to have at most two fan-ins and two fan-outs.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
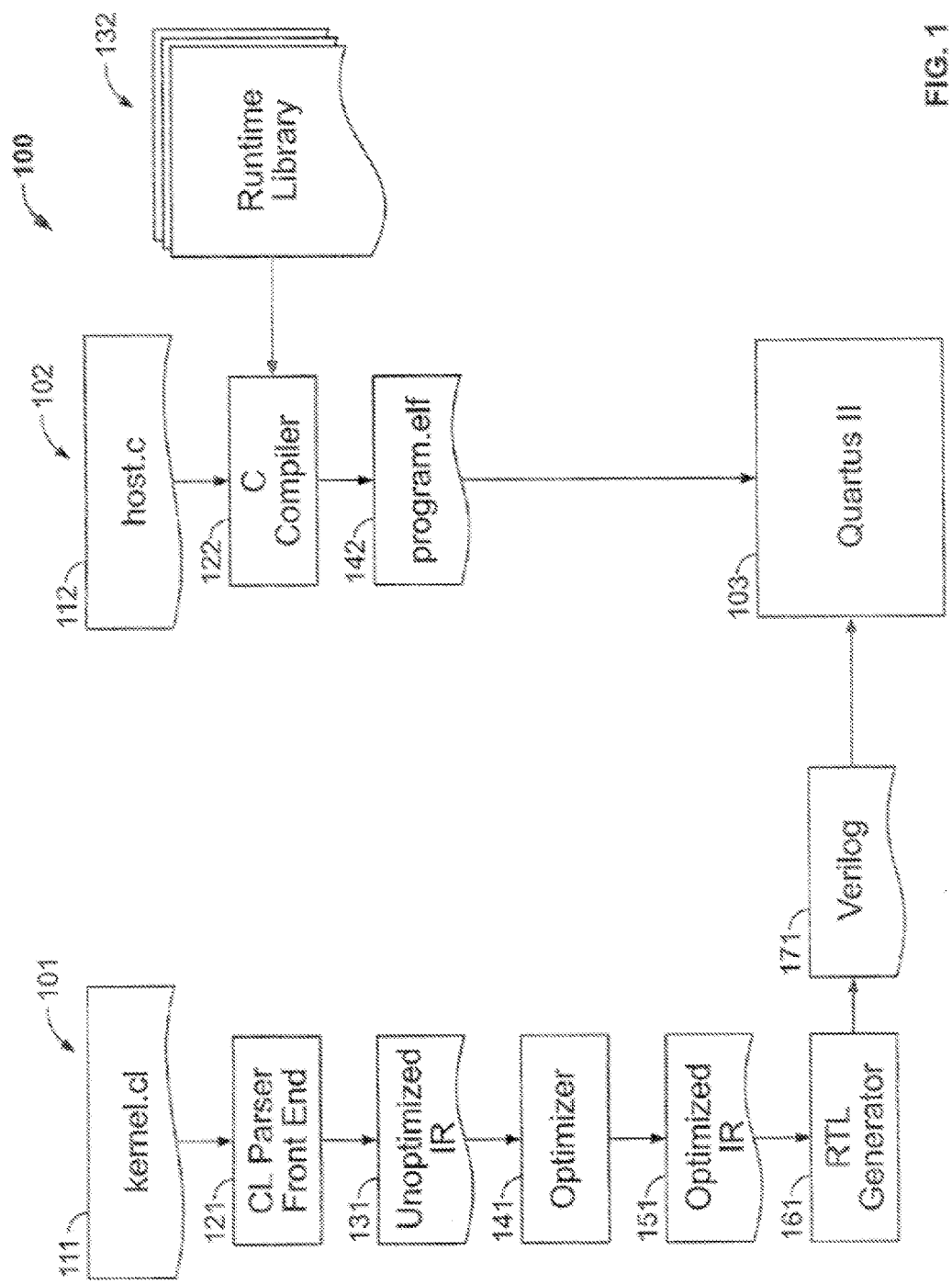
FIG. 1 shows a known method for using a high-level language to configure a programmable device.

In OpenCL, an application is executed in two parts—a host and a kernel. The host is a program responsible for processing I/O requests and setting up data for parallel processing. When the host is ready to process data, it can launch a set of threads on a kernel, which represents a unit of computation to be performed by each thread.

Each thread executes a kernel computation by loading data from memory as specified by the host, processing those data, and then storing the results back in memory to be read by the user, or by the user's application. In OpenCL terminology, a kernel and the data on which it is executing are considered a thread. Results may be computed for a group of threads at one time. Threads may be grouped into workgroups, which allow data to be shared between the threads in a workgroup. Normally, no constraints are placed on the order of execution of threads in a workgroup.

For the purposes of data storage and processing, each kernel may have access to more than one type of memory—e.g., global memory shared by all threads, local memory shared by threads in the same workgroup, and private memory used only by a single thread.

Execution of an OpenCL application may occur partially in the host program and partially by executing one or more kernels. For example, in vector addition, the data arrays representing the vectors may be set up using the host program, while the actual addition may be performed using one or more kernels. The communication between these two parts of the application may facilitated by a set of OpenCL functions in the host program. These functions define an interface between the host and the kernel, allowing the host program to control what data is processed and when that processing begins, and to detect when the processing has been completed.

A programmable device such as an FPGA may be programmed using a high-level language such as OpenCL by starting with a set of kernels and a host program. The kernels are compiled into hardware circuit representations using a Low-Level Virtual Machine (LLVM) compiler that may be extended for this purpose. The compilation process begins with a high-level parser, such as a C-language parser, which produces an intermediate representation for each kernel. The intermediate representation may be in the form of instructions and dependencies between them. This representation may then be optimized to a target programmable device.

An optimized LLVM intermediate representation is then converted into a hardware-oriented data structure, such as in a control flow graph, a data flow graph, or a control-data flow graph. This data structure represents the kernel at a low level, and contains information about its area and maximum clock frequency. The flow graph can then be optimized to improve area and performance of the system, prior to RTL generation which produces a Verilog HDL description of each kernel.

The compiled kernels are then instantiated in a system that preferably contains an interface to the host as well as a memory interface. The host interface allows the host program to access each kernel. This permits setting workspace parameters and kernel arguments remotely. The memory serves as global memory space for an OpenCL kernel. This memory can be accessed via the host interface, allowing the host program to set data for kernels to process and retrieve computation results. Finally, the host program may be compiled using a regular compiler for the high-level language in which it is written (e.g., C++).

Returning to individual parts of the process, to compile kernels into a hardware circuit, each kernel is implemented from basic block modules. Each basic block module comprises an input and an output interface with which it talks to other basic blocks, and implements an instruction such as load, add, subtract, store, etc. As used herein, a "basic block" refers to a basic block module, and is equivalent to a set of instructions that is executed without any branching until the execution is complete.

The next step in implementing each kernel as a hardware circuit is to convert each basic block module into a hardware module. Each basic block module is responsible for handling the operations inside of it. To function properly, a basic block module also should to be able to exchange information with other basic blocks. Determining what data each basic block requires and produces may be accomplished using Live-Variable Analysis.

Once each basic block is analyzed, a flow graph can be created to represent the operation of that basic block module, showing how that basic block module takes inputs either from kernel arguments or another basic block, based on the results of the Live-Variable Analysis. Each basic block, once instantiated, processes the data according to the instructions contained within the block and produces output that can be read by other basic blocks, or directly by a user.

Once each basic block module has been represented as a flow graph, operations inside the block can be scheduled. Each node may be allocated a set of registers and clock cycles that it requires to complete an operation. For example, an AND operation may require no registers, but a floating-point addition may require at least seven clock cycles and corresponding registers. Once each basic block is scheduled, pipelining registers may be inserted to balance the latency of each path through the flow graph. This allows many threads to be processed.

Once each kernel has been described as a hardware circuit, a design may be created including the kernels as well as memories and an interface to the host platform. To prevent pipeline overload, the number of threads allowed in a workgroup, and the number of workgroups allowed simultaneously in a kernel, may be limited.

The foregoing generalized method is diagrammed in FIG. 1 where path 101 shows the implementation of a kernel while path 102 shows the implementation of a host program.

Path 101 starts with a kernel file (kernel.cl) 111. Parser front end 121 derives unoptimized intermediate representation 131 from kernel file 111, which is converted by optimizer 141 to an optimized intermediate representation 151. The optimization process includes compiler techniques to make the code more efficient, such as, e.g., loop unrolling, memory-to-register conversion, dead code elimination, etc. A Register Timing Language (RTL) 161 generator converts optimized intermediate representation 151 into a hardware description language representation 171, which may be written in any hardware description language such as Verilog (shown) or VHDL.

Path 102 starts with a host program file (host.c) 112 which is compiled by a compiler 122 using runtime library 132, which includes software routines that abstract the communication between the host and the programmable device, to create an executable program file 142.

Executable program file 142 and hardware description language representation(s) 171 of the kernel(s) are compiled into a programmable device configuration by appropriate software 103. For example, for FPGA devices available from Altera Corporation, of San Jose, Calif., software 103 might be the QUARTUS® II software provided by Altera.

The result is a programmable device configured to run a host program on kernel files to instantiate circuits represented by the kernels. The programmable device should have an embedded processor to execute program file 142 to execute kernel(s) 111 to generate hardware description language representation(s) 161. If the embedded processor is a "soft" processor, it also may be configured using software 103. If the embedded processor is a "hard" processor, software 103 configures the appropriate connections to the hard processor.

Although the generalized method can be used to create efficient hardware circuit implementations of user logic designs using a high-level language, such as OpenCL, the required compile time can compare unfavorably to that required for convention hardware-description-language-based programming. Depending on the particular user logic design, compilation may take hours or even days, as compared to seconds or minutes for HDL-based programming. The problem of long compile times may be magnified by the need to periodically change a logic design, particularly during development.

Therefore, in accordance with the present invention, multiple high-level language representations of "virtual fabrics"
may be precompiled. Each such virtual fabric 200 (FIG. 2) may be a high-level language representation of a coarse-grained virtual FPGA including an interconnect network 201 of buses 211 and routing switches 221, and a relatively smaller number of more complex function blocks 202-209 representing combinations of logic elements, implemented on top of a physical FPGA having a relatively larger number of individual logic elements. For example, function block 202 performs floating-point subtraction, function blocks 203 and 206 each perform a loading function, function block 204 performs floating-point addition, function blocks 205 and 209 each perform a storing function, function block 207 performs floating-point multiplication, and function block 208 performs a sinusoidal function. In general, the function blocks may include blocks for performing mathematical functions such as fixed- or floating-point additions or multiplications or trigonometric functions, as well as multiplexing logic or even "soft" microprocessors.

Figure 2:
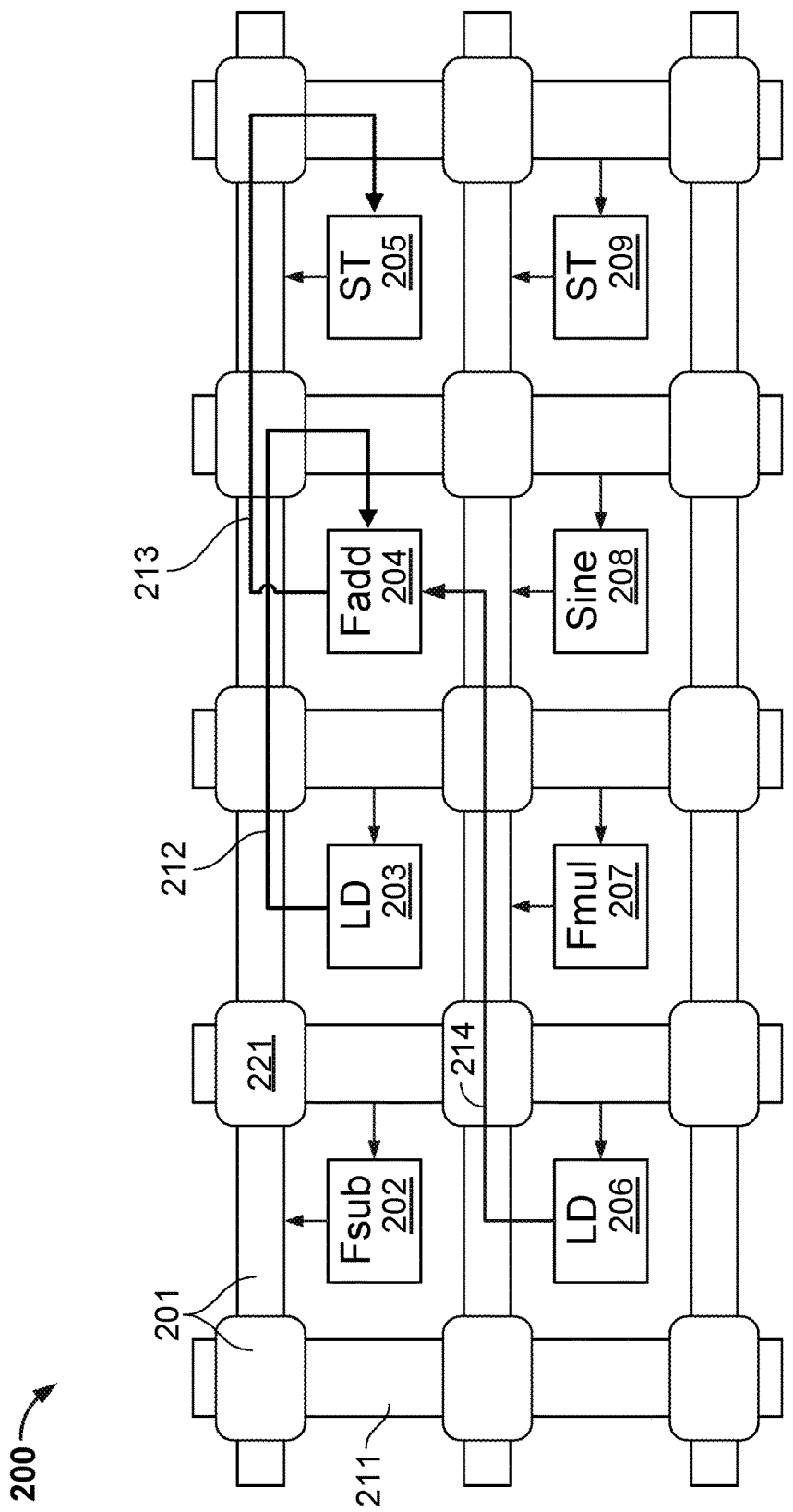
FIG. 2 shows a diagram of an example virtual fabric, in accordance with some embodiments of the present disclosure.

At the fabrication stage, the virtual fabric, such as that shown in FIG. 2 may be built by first implementing the grid in the interconnect network 201. At this stage, the virtual fabric only includes the interconnect network 201 with the various function blocks 202-209, but the connections indicated by the arrows 212-214 are not yet implemented. After the virtual fabric is built, configuration registers in the virtual fabric may be used to implement the arrows 212-214, which may be performed at run time. By using the virtual fabric, which is implemented in the hardware at the fabrication stage, compilation time is significantly reduced, and flow graph representations may be efficiently mapped to the virtual fabric hardware.

A set of multiple virtual fabrics may be considered a library of virtual fabrics. Different virtual fabrics in the library may have different distributions of different types of function blocks. For example, the library may include a set of different basic virtual fabrics, of which fabric 200 is just one example, each of which has a different distribution of function blocks 202 including basic mathematical functions along with multiplexing logic.

Figure 3:
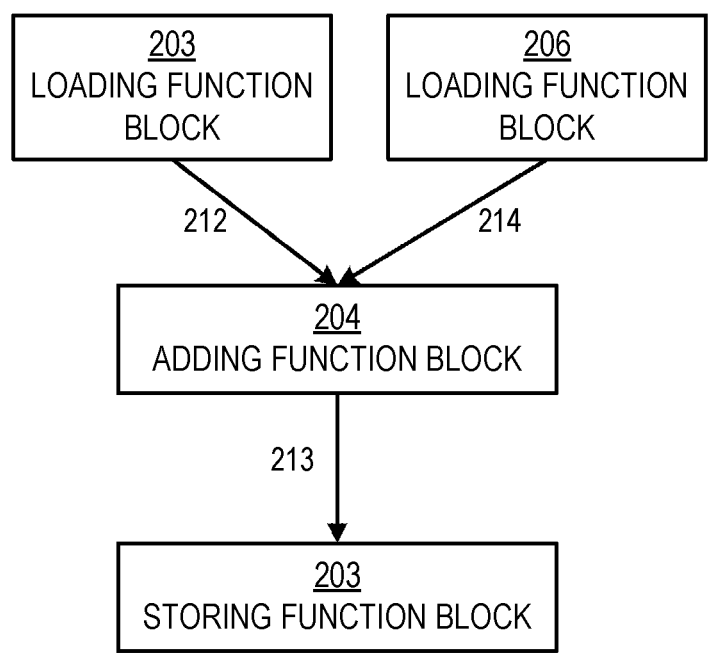
FIG. 3 shows a diagram of an example data flow graph, in accordance with some embodiments of the present disclosure.

As shown in FIG. 2, the various function blocks 202-209 may be connected over the interconnect network 201. In particular, loading function block 203 provides an input to adding function block 204 over connection 212, loading function block 206 provides an input to adding function block 204 over connection 214, and adding function block 204 provides the sum of its inputs to storing function block 205 over connection 213. While FIG. 2 shows a precompiled virtual fabric implementation of the function blocks and their connections, FIG. 3 shows function blocks 203, 204, 205, and 206 and connections 212, 213, and 214 in a representation using a data flow graph 300. In the simple examples shown in FIGS. 2 and 3, values are loaded at loading function blocks 203 and 206, added at adding function block 204, and the sum is stored at storing function block 205. In general, one of ordinary skill in the art will understand that the simple examples shown in FIGS. 2 and 3 are shown for illustrative purposes only, and that more complex functions and blocks may be used without departing from the scope of the present disclosure.

Mappings from data flow graphs to precompiled networks of functional units are described in detail in relation to U.S. patent application Ser. Nos. 13/369,829 and 13/369,836, each of which is incorporated herein by reference in its entirety. However, most practical applications include both control flow as well as data flow. In general, control flow may be more complicated than data flow. In an example, a kernel that includes a loop with dynamic bounds may be implemented using a control flow graph, but is more difficult to be implemented using a data flow graph. The systems and methods of the present disclosure allow for mapping of control flow graphs to precompiled networks of functional units.

Figure 4:
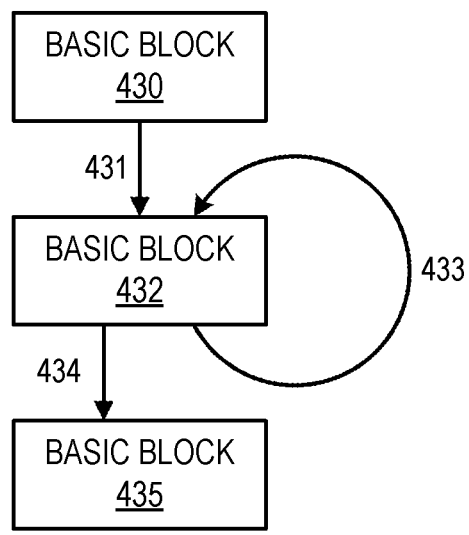
FIG. 4 shows a diagram of an example control flow graph, in accordance with some embodiments of the present disclosure.

FIG. 4 shows an example block diagram of a control flow graph 400. Control flow graph 400 includes three basic blocks 430, 432, and 435 connected over three branches 431, 433, and 434. In particular, control flow graph 400 represents the flow of a kernel that may include a for loop. As an example, basic block 430 may include an initialization process that initializes a result variable res to zero. Basic block 430 may be written in OpenCL as:

int res=0;

Basic block 432 may include the body of the for loop. In an example, the for loop may update the result variable res by adding a product of two values a[i] and b[i] to the current value of the result variable res, where the variable i corresponds to the iteration number in the for loop. The variable i may be initialized to zero and may be incremented until i reaches a threshold value n. Each time that the variable i is incremented, branch 433 is traversed to return to basic block 432 to update the value of the result variable res. Basic block 432 may be written in OpenCL as:

for (int i=0; i<n; i++)
      res+=a[i]*b[i];

When i reaches n, the process proceeds along branch 434 to basic block 435, which stores the result variable. Basic block 435 may be written in OpenCL as:

answer[0]=res;

It may be desirable to implement the flow shown in control flow graph 400 on a precompiled virtual fabric such as the virtual fabric shown in FIG. 2.

The functionality in basic block 432 may be described as two fundamental computational operations. First, the loop index variable i is input, incremented, and provided as output. Second, the result variable res is input, updated to reflect an addition of a[i]*b[i] to the value res, and the sum is provided as output. The values of the inputs i and res depend on the control flow. In particular, both inputs are initialized to zero if the program has branched to basic block 432 from basic block 430 via connection 431. Alternatively, if the program has branched to basic block 432 from basic block 432 via connection 433, the inputs carry the current accumulated values, rather than the initialized values.

Figure 5:
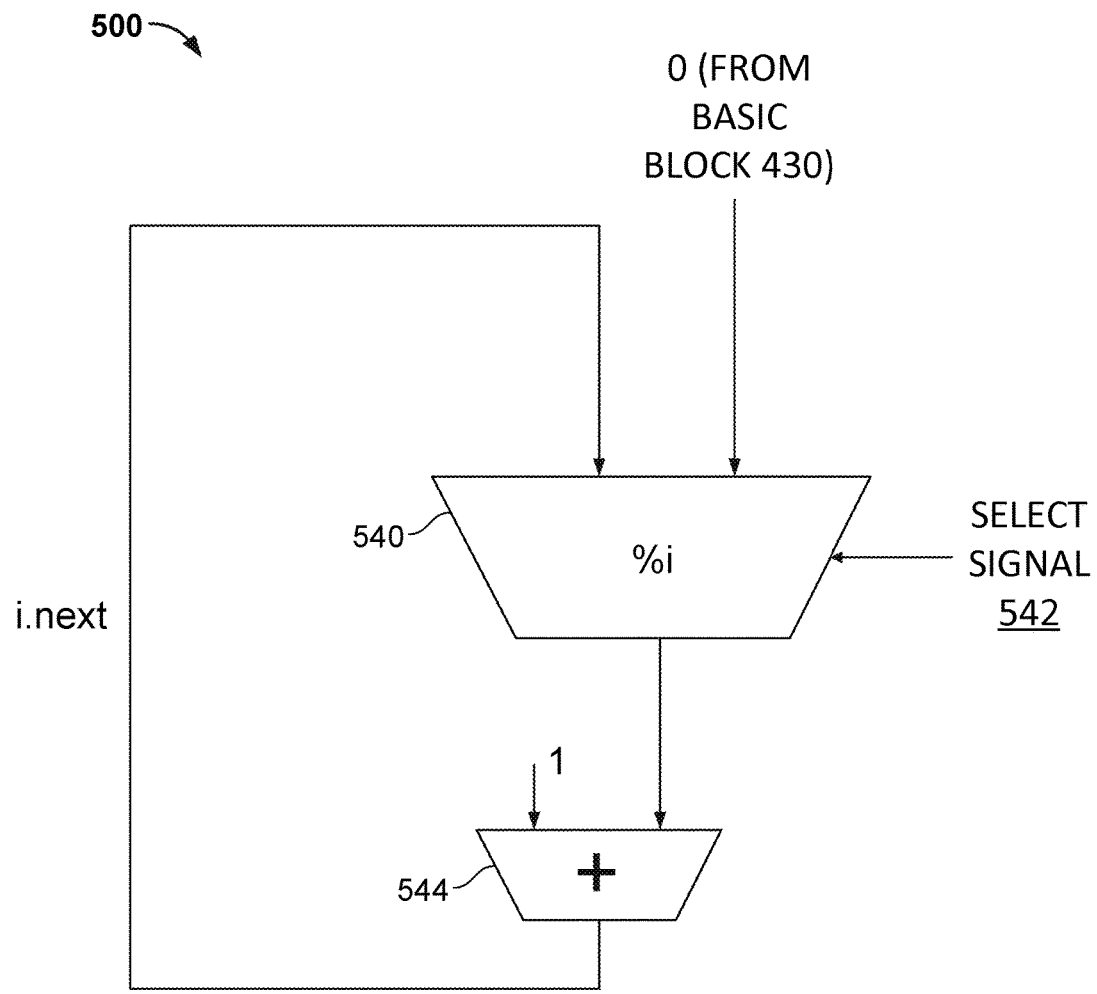
FIG. 5 shows a diagram of an implementation of a PHI node for a loop index variable, in accordance with some embodiments of the present disclosure.

One or more "PHI" nodes may be used to produce the appropriate value based on the branching behavior. As used herein, a PHI node is a data selector node that selects a value for a variable based on the incoming branches. One or more PHI nodes may be used internally by a compiler to implement the updating of a variable value. As an example, a PHI node instruction such as:

% i=phi i32 [% i.next, % B433], [0, % B431]

indicates that the value of the loop index variable i is zero when branch 431 (i.e., B431) was used to arrive at basic block 432, and that the value of the loop index variable i is i.next when branch 433 (i.e., B433) was used to arrive at basic block 432 (i.e., the current basic block). An example of an implementation of the PHI node for the loop index variable i is shown in FIG. 5, which includes a multiplexer 540 and an adder 544. A select signal 542 is used to select the 0 input to multiplexer 540 when branch 431 was used to arrive at basic block 432 from basic block 430, and to select the i.next input when branch 433 was used to arrive at basic block 432 from basic block 432. Adder 544 increments the loop index variable i and sets the incremented value to i.next.

Figure 6:
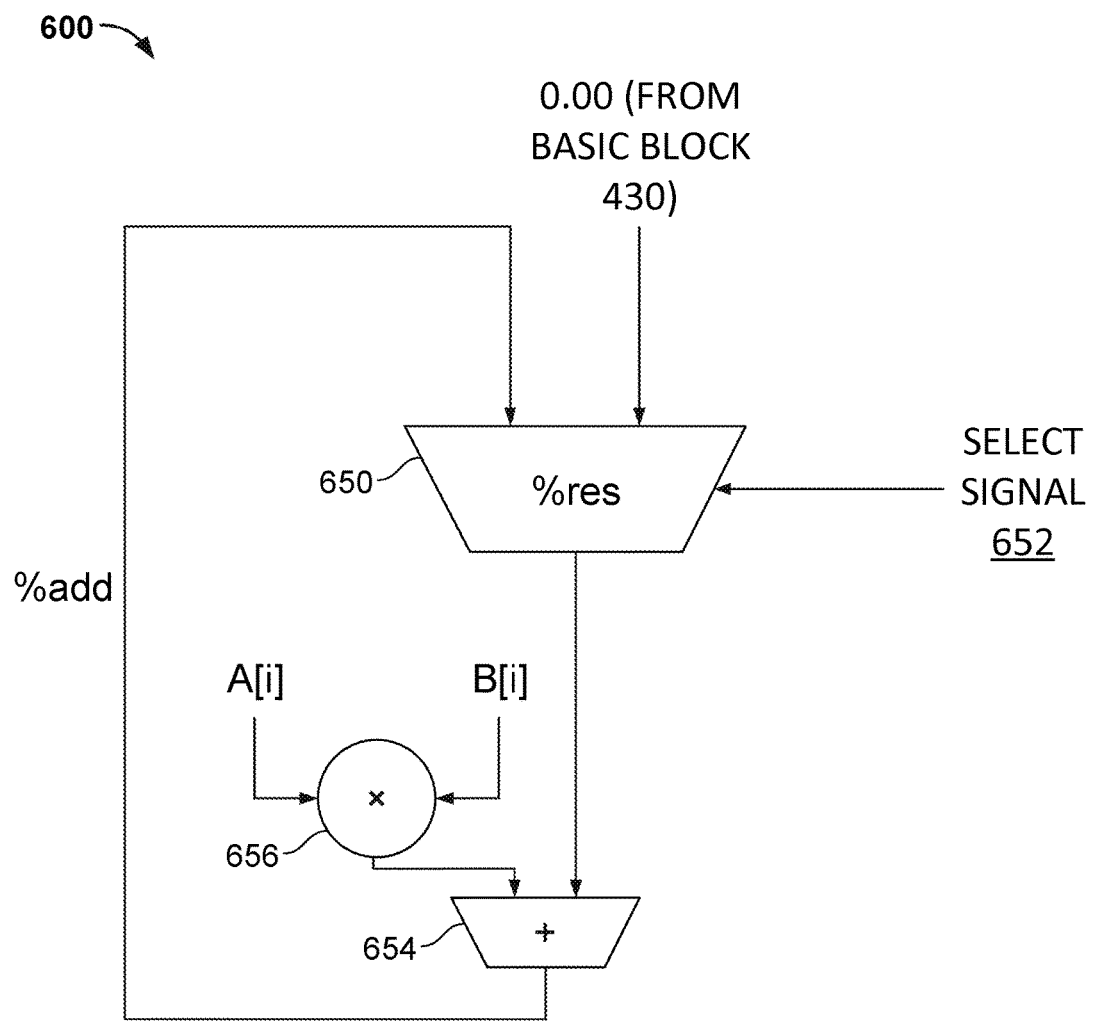
FIG. 6 shows a diagram of an implementation of a PHI node for a result variable, in accordance with some embodiments of the present disclosure.

Similarly, another PHI node instruction such as:

% res=phi float [% add, % B433], [0.000000e+00, % B431]

indicates that the value of the result variable res is zero when branch 431 was used to arrive at basic block 432, and that the value of the result variable res is the resulting sum (i.e., add) when branch 433 (i.e., B433) was used to arrive at basic block 432 (i.e., the current basic block). An example of an implementation of the PHI node of the result variable res is shown in FIG. 6, which includes a multiplexer 650, a multiplier 656, and an adder 654. A select signal 652 is used to select the 0.00 input to multiplexer 650 when branch 431 was used to arrive at basic block 432 from basic block 430, and to select the output of adder 654 (i.e., the % add variable) when branch 433 was used to arrive at basic block 432 from basic block 432. Adder 543 increments the result variable res by the product between A[i] and B[i], which is provided by multiplier 656.

The PHI nodes as described above may be used to select appropriate values for the inputs and are dependent on the branching behavior. The PHI node implementations shown in FIGS. 5 and 6 are for illustrative purposes only, and one of ordinary skill in the art will understand that other PHI node implementations may be used, including any implementation that selects a value based on branching.

A remainder of the intermediate representation may be represented as:

arrayidx1=getelementptr float*% a, i64% i
    %1=load float (float addrspace(1)*% arrayidx1)
    % arrayidx2=getelementptr float*% b, i64% i
    %2=load float (float addrspace(1)*% arrayidx2)
    % mul=fmul float %1, %2
    add=fadd float % res, % mul
    % i.next=add i32% i, 1%
    exitcond=icmp eq i32% i.next, % n
    br % exitcond, label % B434, label % B433

As shown in the intermediate representation above, an index for the adding operation may be assigned 32 bits, while indices that represent address space in a main memory may be assigned 64 bits to allow for enough memory addresses to be index. The last line of the above intermediate representation indicates to which basic block should basic block 432 transfer control after execution of basic block 432 is complete. In particular, an exit condition % exitcond is defined as a comparison between the loop iteration variable i.next and the bound of the loop n. When i.next and n are the same, this means that the iteration loop variable i has reached the bound of the for loop, and the exit condition is satisfied. When this happens, basic block 432 transfers control to basic block 435 via branch 434. When i.next and n are not the same, the exit condition is not yet satisfied, and branch 433 is chosen such that basic block 432 maintains control.

Figure 7:
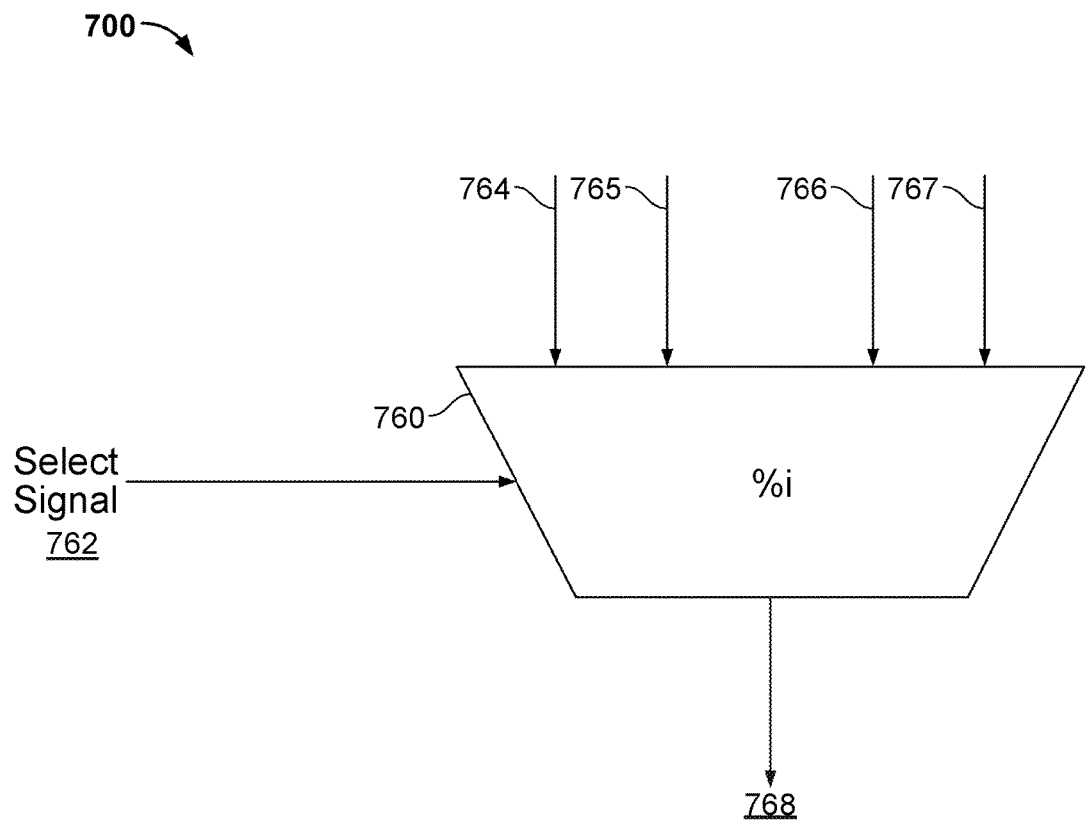
FIG. 7 shows a diagram of a multiplexer with data inputs and predicate inputs, in accordance with some embodiments of the present disclosure.

FIG. 7 shows an example block diagram 700 of a multiplexer with data inputs as well as predicate inputs. In particular, multiplexer 760 receives a first data input 764, which is accompanied by a first predicate input 765, and a second data input 766, which is accompanied by a second predicate input 767. Predicate inputs 765 and 767 provide indications of the basic block for which the corresponding data inputs 764 and 766 are intended. While FIG. 7 only shows two data inputs 764 and 766 and two predicate inputs 765 and 767, any suitable number of data inputs and predicate inputs may be used without departing from the scope of the present disclosure.

The use of predicate signals may be desirable in order to simply the circuitry that connects various basic blocks. In particular, it may be desirable to allow a first basic block to transmit output signals to all the basic blocks to which the first basic block is connected. In this case, each of the receiving basic blocks may be configured to use the predicate signal to determine whether a received signal is intended for the respective receiving basic block, or for another destination. By using predicate signals to allow for this functionality, the circuitry is simplified because only a single output may need to be specified for each basic block. Moreover, the use of predicate signals may allow for the basic blocks to be always connected to one another, such that switches are not necessary. In some embodiments of the present disclosure, one or more PHI nodes at the receiving basic blocks are configured to perform filtering of the received signals so that the receiving basic blocks only receive the signals that are intended for them.

Figure 8:
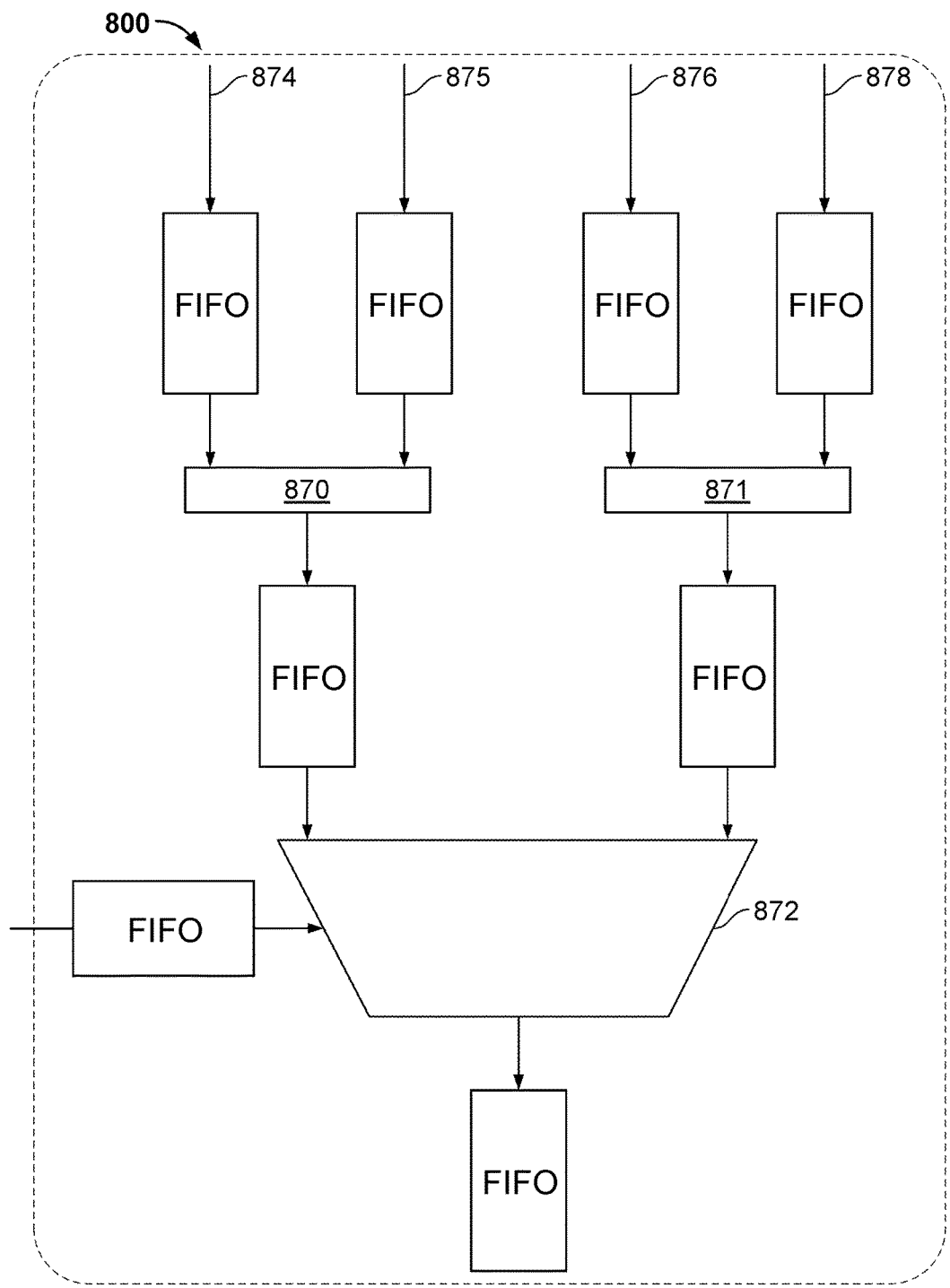
FIG. 8 shows a diagram of a PHI node for use in a virtual fabric, in accordance with some embodiments of the present disclosure.

FIG. 8 shows an example block diagram 800 of a PHI node for use in a virtual fabric. The PHI node monitors data from source basic blocks, which correspond to basic blocks from which the PHI node receives data. In particular, the PHI node receives data signals 874 and 876 and predicate signals 875 and 878, each of which is provided to a first-in, first-out (FIFO) buffer. The FIFO buffers provide inputs into filters 870 and 871, which filter the data signals 874 and 876 based on the predicate signals 875 and 878. In particular, if predicate signal 875 indicates that the corresponding data signal 874 is intended for the current basic block, filter 870 allows data signal 874 to pass through to another FIFO buffer and multiplexer 872. Otherwise, if predicate signal 875 indicates that the corresponding data signal 874 is not intended for the current basic block, filter 870 blocks data signal 874 from passing through. Similarly, filter 871 allows data signal 876 to pass through or blocks data signal 876 based on whether predicate signal 878 indicates that the corresponding data signal 876 is intended for the current basic block.

A selection signal is provided to multiplexer 872 to select one of the data signals 874 and 876, assuming that at least one data signal has passed through filter 870 or filter 871. The FIFO buffers shown in FIG. 8 may be used to balance latencies between data signals and their corresponding predicate signals. In particular, it is unlikely that the data signals and their corresponding predicate signals are generated on the same time cycle, and the FIFO buffers may be used to synchronize the signals. While two data signals 874 and 876 and two predicate signals 875 and 878 are shown in FIG. 8, one of ordinary skill in the art will understand that any suitable number of data signals or predicate signals may be used without departing from the scope of the present disclosure. In particular, multiple multiplexers such as multiplexer 872 may be used to select a data signal from the input data signals. In some embodiments, multiplexer 872 may be configured to receive more than two inputs.

Figure 9:
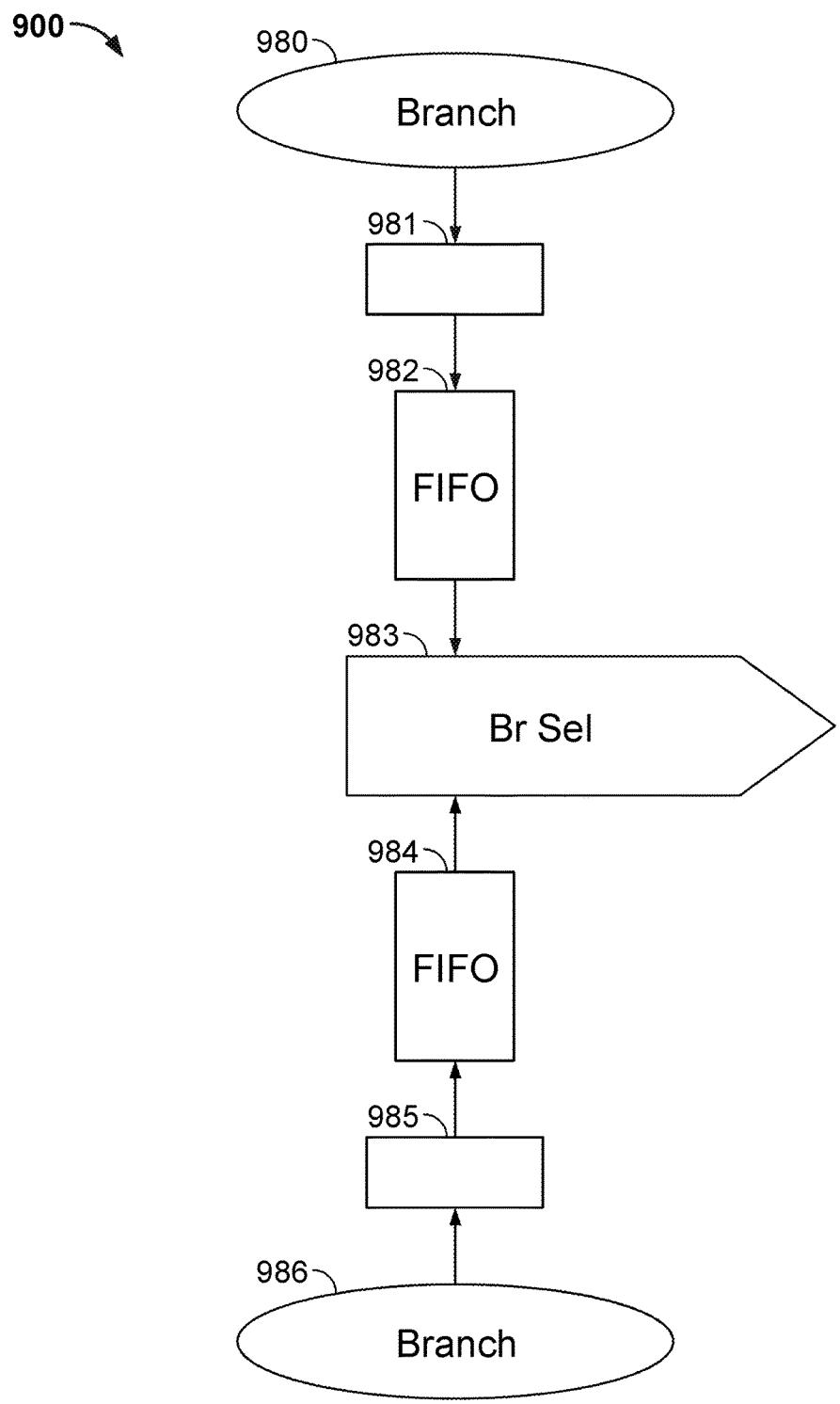
FIG. 9 shows a diagram of a branch select block for use in a virtual fabric, in accordance with some embodiments of the present disclosure.

FIG. 9 shows an example block diagram 900 of a branch select block for use in a virtual fabric. The branch select block includes two source branch nodes 980 and 986, two filters 981 and 985, two FIFO buffers 982 and 984, and a branch select module 983. Source branch nodes 980 and 986 may correspond to one or more logic nodes that implement one or more logic functions. When a source branch node corresponds to more than one logic node, the logic nodes may be arranged in a hierarchy. In an example, the current basic block may correspond to basic block 432, shown and described in relation to FIG. 4. Source branch node 980 corresponds to branch 431, which originates from basic block 430, and source branch 986 corresponds to branch 433 from the current basic block (i.e., basic block 432). Filters 981 and 985 perform similar filtering functions as filters 870 and 871 in FIG. 8, but filters 981 and 985 may filter the signals received from source branch nodes 980 and 986 based on one or more configuration settings. In an example, a configuration setting of a branch select block may correspond to a particular bit or symbol pattern in the resulting data that indicates whether the input is valid or invalid. When the data matches the particular bit or symbol pattern, the input may be valid, and when there is no match between the data and the pattern, the input may be invalid.

In an example, branch select module 983 is configured to select the first valid branch signal that is received and is intended for the current basic block. Branch select module 983 provides an output signal, which indicates which input from a source branch is selected. The output signal may include a single bit, or may include multiple bits. In general, more than one previous basic block may request to jump to a current basic block. In this case, branch select module 983 may be configured to implement any type of priority scheme for resolving the multiple requests. In one example, when two branch signals are valid simultaneously, the branch from the current basic block (i.e., branch 986) may be selected, such that the loop caused by selecting branch 986 is allowed to continue. In this case, the branch signal from branch node 980 may be held in FIFO 982 for a period of time until execution of the loop is complete.

In some embodiments, it may be desirable to use branch select module 983 to not only select the appropriate branch signal, but to also determine the appropriate data signal to use for the current basic block. However, this implementation may be difficult to implement, and it may instead be desirable to separate the data signals from the control signals such that the PHI nodes determine the appropriate data signals, while branch select modules determine the appropriate control signals.

One or both of branch nodes 980 and 986 may receive one or more completion signals. A completion signal may provide an indication that the processing in the current basic block is complete. In particular, storing data to memory units should be completed within the current basic block before branching to another basic block. This is desirable because the next basic block may load these values from the memory units. In one example, to ensure that the storing of data to memory units within the current basic block is completed, branch nodes 980 and 986 may receive completion signals, each completion signal indicating whether certain processing with the current basic block is complete. In particular, each completion signal may take on a value of 0 until the process is complete, after which the completion signal takes on a value of 1. In this case, each of branch nodes 980 and 986 may be implemented as one or more AND gates, such that the branch nodes 980 and 986 only provide an output of 1 when all completion signals indicate that all the processing within the current basic block is complete. In an example, each branch node 980 and 986 may be implemented as a four-input AND gate.

In some embodiments, branch nodes 980 and 986 may further provide an output signal referred to herein as a branch condition, which indicates which of the successor or receiving basic blocks is the desired destination of the branching. In some embodiments, branch nodes 980 and 986 may further provide a validity bit that indicates when the output signal has a meaningful value. As described above, a configuration setting of a branch select block may set the meaningful value to include a particular bit or symbol pattern, such that when the output signal (i.e., the branch condition) matches the particular bit or symbol pattern, the corresponding branch is valid. The AND gate may receive an input from a store unit, which provides a data value of '1' and a data valid bit when the memory store unit is complete. In general, any suitable logic gate may be used, such as AND gates with any number of inputs. As shown in FIG. 9, branch select module 983 selects between inputs from two branch nodes 980 and 986. However, in general, a branch select module may select across inputs from any suitable number of branch nodes, including a single branch node, without departing from the scope of the present disclosure.

Figure 10:
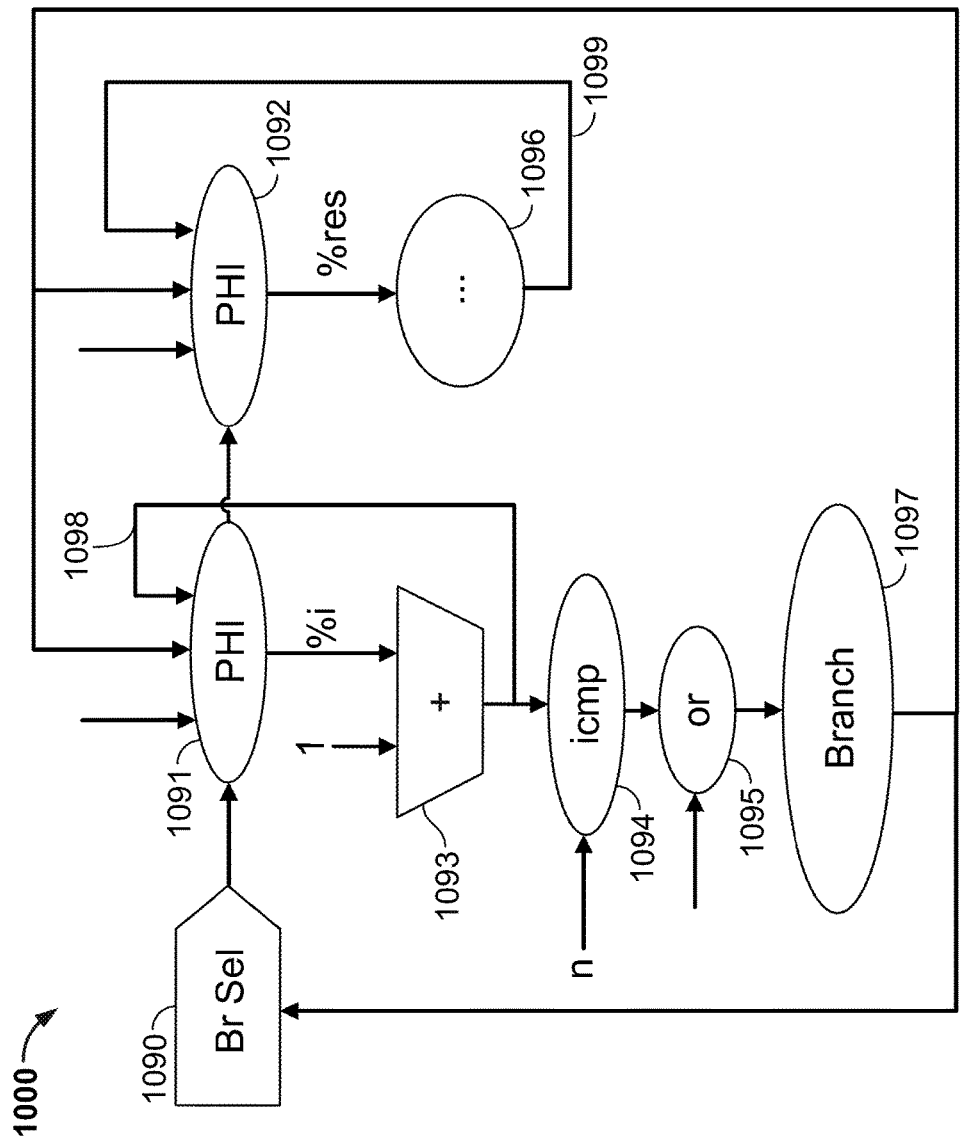
FIG. 10 shows a diagram of an example implementation of distributed control flow, in accordance with some embodiments of the present disclosure.

FIG. 10 is an example block diagram 1000 of an implementation of distributed control flow. In particular, diagram 1000 includes a branch select node 1090, two PHI nodes 1091 and 1092, an adder 1093, a comparator 1094, an OR gate 1095, a branch node 1097, and other processing blocks 1096. PHI node 1091 may be implemented in a similar manner as the PHI node shown in FIG. 5 for the loop index variable i. PHI node 1091 provides an output signal corresponding to the current loop index variable i, which is incremented at adder 1093, and branch 1098 forms the loop that continues to increment the loop index variable i until the sum reaches n, as is determined by comparator 1094. As shown in FIG. 10, OR gate 1095 provides a value for the branch condition to branch node 1097. OR gate 1095 receives a first input from comparator 1094 and a second input that may stem directly or indirectly from another node within the basic block, such as either of PHI nodes 1091 or 1092, or another PHI node that is not shown in FIG. 10. OR gate 1095 is shown as an illustrative example only, and in general, any type of block or logic gate may provide the branch condition to branch node 1097. When the loop index variable i reaches n, or when another input indicates the branch condition, the process reaches branch node 1097, which provides input to branch select node 1090, PHI node 1091, and PHI node 1092. In particular, the output of branch node 1097 may be a predicate signal that indicates an intended destination of the output data. PHI node 1092 may be implemented in a similar manner as the PHI node shown in FIG. 6 for the result variable res.

PHI node 1092 provides the current value of the variable res to processing block 1096, which performs various processing on the variable res before returning to PHI node 1092 via branch 1099. Diagram 1000 illustrates that branch select nodes, such as branch select node 1090, and PHI nodes, such as PHI nodes 1091 and 1092 may be easily wired together to implement arbitrary control flow. Furthermore, as shown in FIG. 10, the data that travels on branches 1098 and 1099 remain physically close to PHI nodes 1091 or 1092. By allowing the data signals to remain physically close to the PHI nodes, the diagram of FIG. 10 conserves the resources on the integrated circuit. In particular, allowing the data signals to reach branch node 1097 may create congestion on the connections and the wires near branch node 1097. Keeping the data signals on local connections proximate to the PHI nodes reduces the travel time of the data signals, thereby saving the resources of the device.

Figure 11:
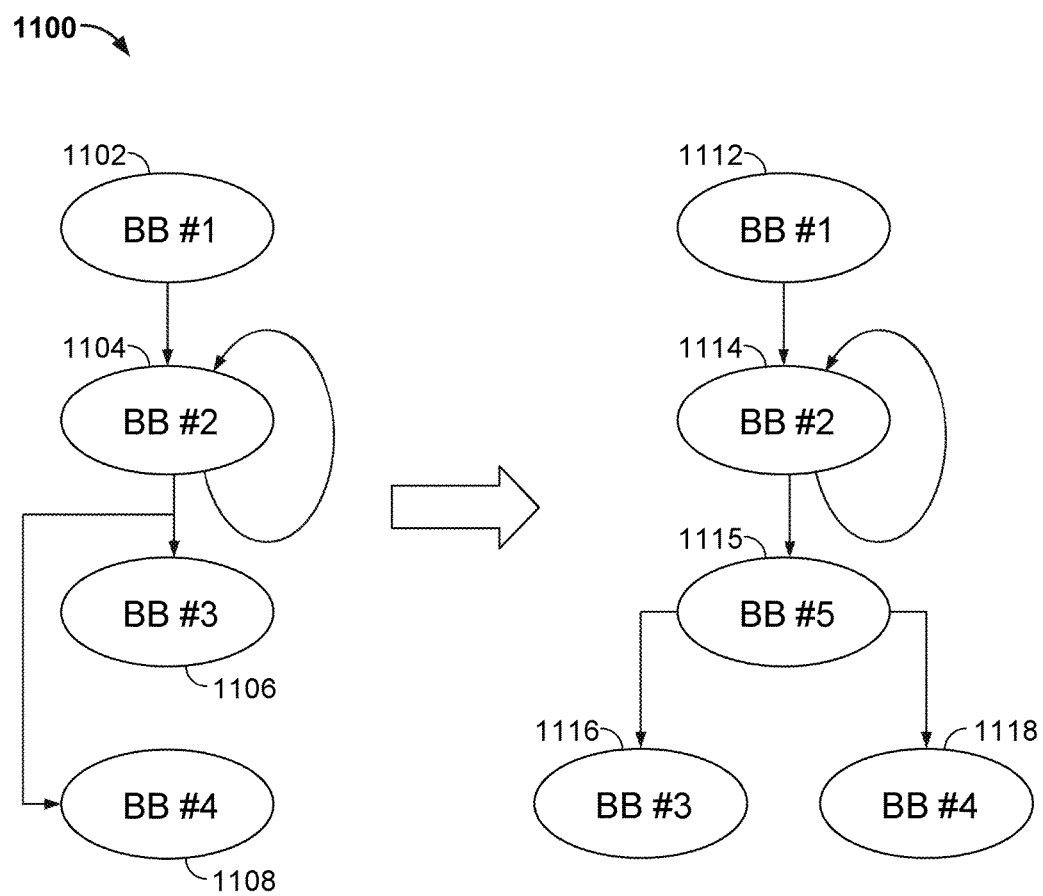
FIG. 11 shows a diagram of two equivalent control flow graphs that have different numbers of fan-outs, in accordance with some embodiments of the present disclosure.

FIG. 11 is an example block diagram 1100 of two equivalent control flow graphs that have different numbers of fan-outs, or output branches. In particular, the diagram on the left of FIG. 11 includes four basic blocks 1102, 1104, 1106, and 1108. In particular, basic block 1102 branches to basic block 1104 (one fan-out), which branches to three basic blocks 1104, 1106, and 1108 (three fan-outs). It may be generally desirable to implement the control flow of three fan-outs using one bit at a time. To implement the same control flow of the three fan-outs as shown on the left diagram, the control of the right diagram in FIG. 11 may be used. In particular, the right diagram includes five basic blocks 1112, 1114, 1115, 1116, and 1118. Basic blocks 1112, 1116, and 1118 correspond to basic blocks 1102, 1106, and 1108, respectively. However, the control flow of basic block 1114 is different from the control flow of basic block 1104. In particular, basic block 1114 has two fan-outs—one to itself and one to a new basic block 1115, which also has two fan-outs—one to basic block 1116 and one to basic block 1118. As shown in FIG. 11, control flows with more than two fan-ins or fan-outs may be implemented using single bit control signals by adding intermediate basic blocks. Diagram 1100 is shown as an illustrative example only, and one of ordinary skill in the art will understand that intermediate basic blocks may be added to any type of control flow to implement any number of fan-ins or fan-outs.

Figure 12:
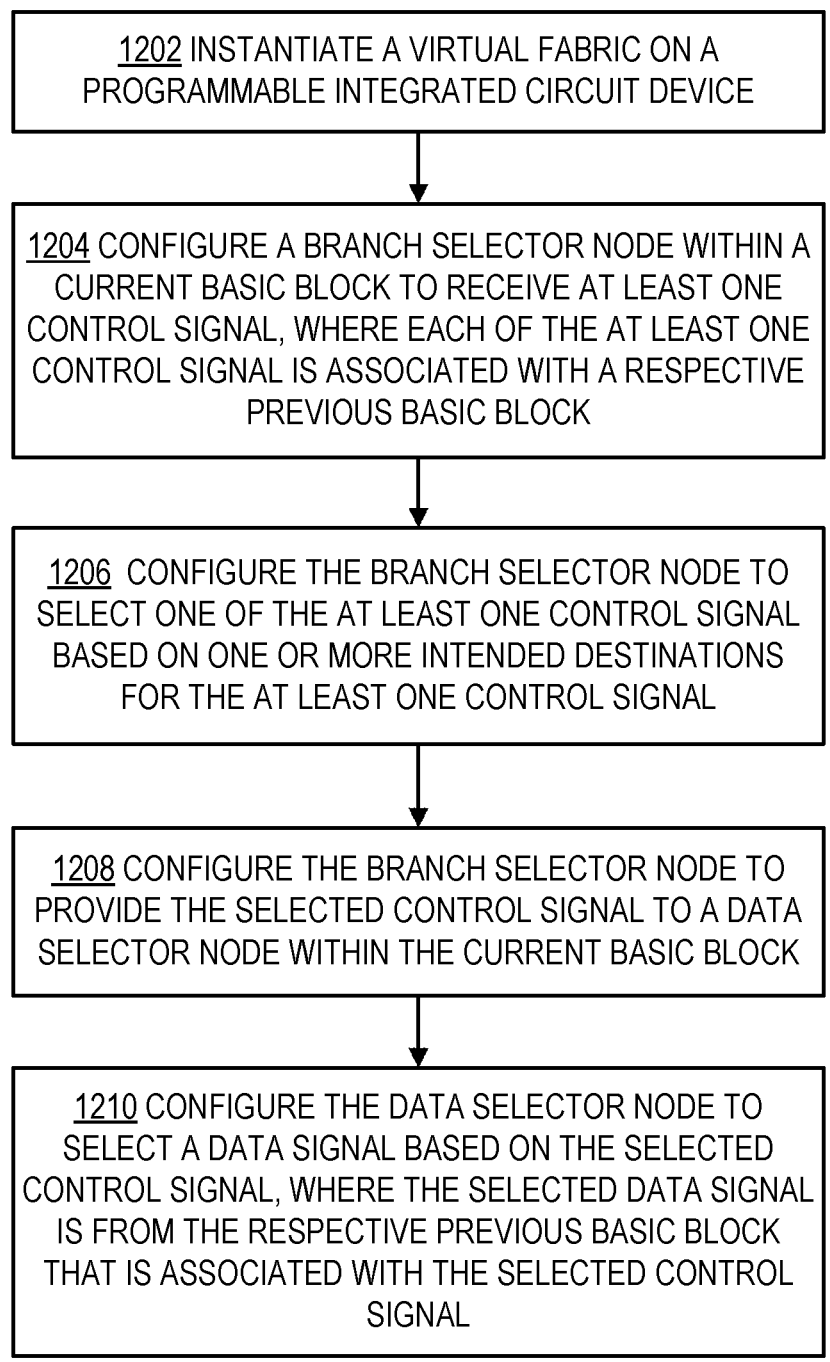
FIG. 12 shows an illustrative flow diagram of a process for implementing control flow at a current basic block, in accordance with some embodiments of the present disclosure.

FIG. 12 shows an illustrative flow diagram of a process 1200 for configuring a programmable integrated circuit device to implement control flow at a current basic block that is within a virtual fabric. FIG. 12 illustrates the operation of a basic block within the virtual fabric by using a branch selector node and a data selector node.

At 1202, a virtual fabric is instantiated on a programmable integrated circuit device. As described in relation to FIG. 2, one or more virtual fabrics may be precompiled and represented using one or more high-level language representations. Each virtual fabric may be a high-level language representation of a coarse-grained virtual FPGA including an interconnect network and a number of function blocks that represent various combinations of logic elements. The interconnect network and the function blocks may be implemented on top of a physical FPGA having a relatively larger number of individual logic elements. As described herein, multiple basic blocks may be configured within the virtual fabric, as well as interconnections that provide connectivity between the basic blocks. Each basic block may include a branch selector node, a branch node including one or more logic units, and a data selector node (i.e., a PHI node).

At 1204, a branch selector node is configured within the current basic block to receive at least one control signal. Each control signal is associated with a respective previous basic block. The branch selector node may correspond to branch selector module 983 shown and described in relation to FIG. 9, in which the branch selector node receives two control signals (i.e., two branch signals) from two branch nodes 980 and 986, each of which originated from previous basic blocks. As described in relation to FIG. 9, the current basic block may correspond to basic block 432 of FIG. 4. Source branch node 980 may correspond to branch 431, which originates from basic block 430 (i.e., a previous basic block), and source branch 986 may correspond to branch 433 from the current basic block (i.e., basic block 432, or another previous basic block). In particular, the respective "previous basic blocks" may correspond to the same basic block as the current basic block, or different basic blocks.

At 1206, the branch selector node at the current basic block is configured to select one of the at least one control signal based on one or more intended destinations for the at least one control signal. In particular, branch selector module 983 may be configured to select the first valid control signal that is intended for the current basic block.

At 1208, the branch selector node is configured to provide the selected control signal to a data selector node in the current basic block. The data selector node corresponds to a PHI node as described herein, and may be implemented using one or more multiplexers and first-in-first-out buffers. As shown and described in relation to FIG. 8, the PHI nodes may include buffers for temporarily storing the data signals and the predicate signals, and for temporally align the data signals and the predicate signals. In this way, the buffers within the PHI nodes enable for the two signal types to be synchronized so that the appropriate data signals are selected at appropriate times. The one or more control signals provided to the data selector node from the branch selector node corresponds to the select signal input to the multiplexer, which provides an indication of which data signal to select at the data selector node.

At 1210, the data selector node is configured to select a data signal based on the selected control signal. The selected data signal is from the respective previous basic block that is associated with the selected control signal. In particular, as shown and described in relation to FIG. 8, the PHI nodes may perform filtering of the data signals based on predicate signals, which indicate whether the incoming data signals are intended for the current basic block or another basic block. As an example, implementations of a data selector node are shown and described in relation to FIGS. 5 and 6. In particular, FIG. 5 shows an implementation of a data selector node that updates a loop index variable in a for loop, and FIG. 6 shows an implementation of a data selector node that updates a result variable in the same for loop.

Figure 13:
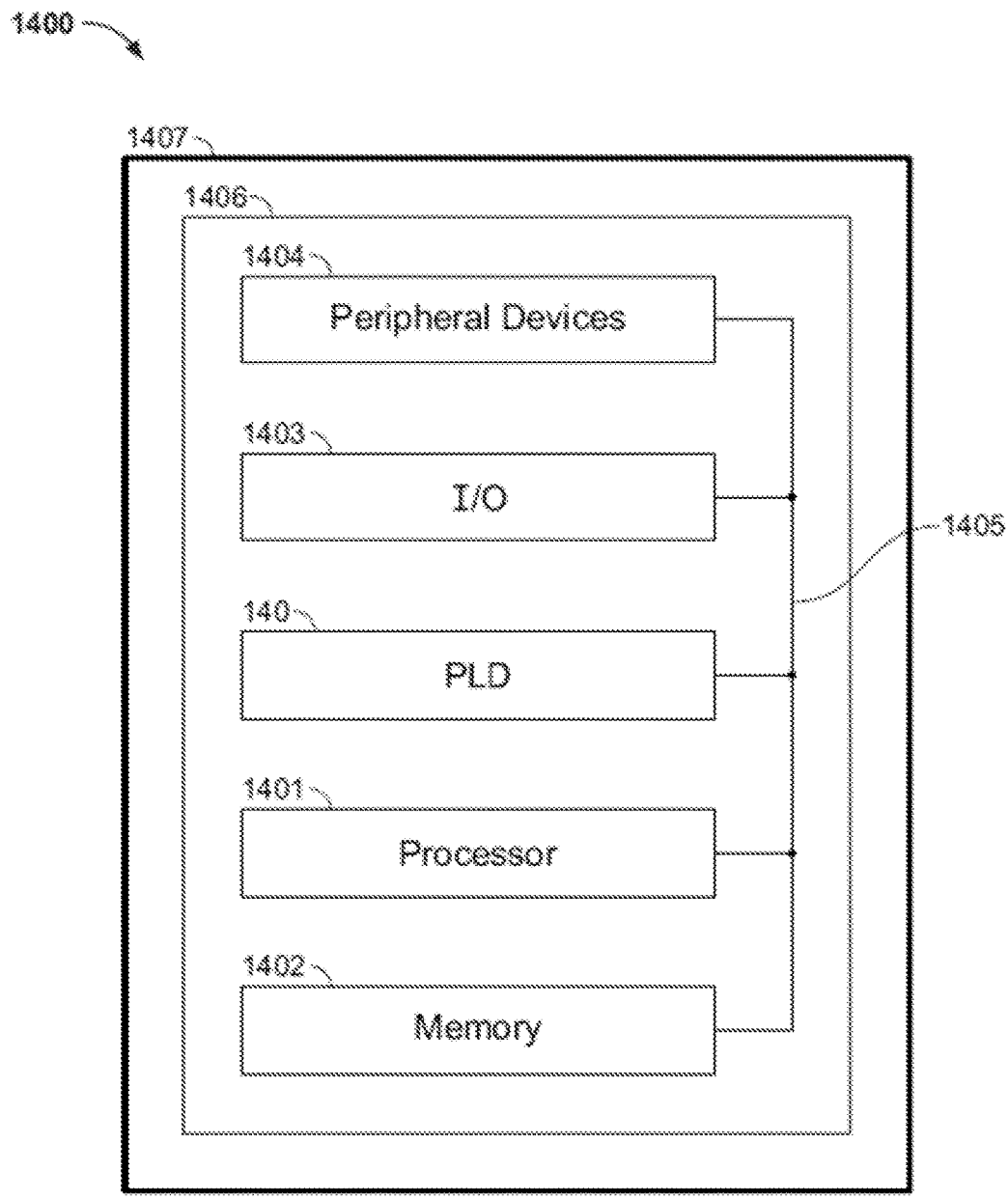
FIG. 13 is a simplified block diagram of an illustrative system employing a programmable logic device incorporating the present disclosure.

A PLD 1400 programmed according to the present disclosure may be used in many kinds of electronic devices. One possible use is in a data processing system 1400 shown in FIG. 13. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

System 1300 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 1400 can be configured as a processor or controller that works in cooperation with processor 1401. PLD 1400 may also be used as an arbiter for arbitrating access to a shared resources in system 1300. In yet another example, PLD 1400 can be configured as an interface between processor 1401 and one of the other components in system 1300. It should be noted that system 1300 is only exemplary, and that the true scope and spirit of the invention should be indicated by the following claims.

Various technologies can be used to implement PLDs 1400 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of configuring a programmable integrated circuit device to implement control flow at a current basic block of a set of function blocks, the method comprising:
instantiating a virtual fabric on the programmable integrated circuit device, the virtual fabric comprising the function blocks comprising pre-compiled combinations of logic elements that perform specific operations, wherein a flow within the virtual fabric between the function blocks is configured at runtime;
configuring the flow within the virtual fabric at runtime, wherein configuring the flow comprises:
configuring a branch selector node within the current basic block to:
receive at least one control signal, wherein the at least one control signal is associated with a respective previous basic block;
select one of the at least one control signal based on one or more intended destinations for the at least one control signal; and
provide the selected control signal to a data selector node within the current basic block; and
configuring the data selector node to select a data signal based on the selected control signal, wherein the selected data signal is from the respective previous basic block that is associated with the selected control signal.

2. The method of claim 1, wherein configuring the current basic block further comprises configuring a respective logic node for each respective previous basic block to transmit each of the at least one control signal to the branch selector node.

3. The method of claim 1, wherein configuring the current basic block further comprises configuring at least one of the branch selector node and the data selector node as one or more multiplexers.

4. The method of claim 1, wherein the selected data signal is a variable value.

5. The method of claim 4, wherein the variable value is an index variable or a result variable for a loop.

6. The method of claim 1, wherein configuring the current basic block further comprises configuring each of the respective previous basic blocks to provide completion signals that indicate when processing in each of the respective previous basic blocks is complete.

7. The method of claim 1, wherein the one or more intended destinations for the at least one control signal are indicated using predicate signals.

8. The method of claim 1, wherein the data selector node is configured to select the data signal by filtering a plurality of incoming data signals based on the selected control signal and a value of the selected control signal.

9. The method of claim 1, wherein configuring the current basic block further comprises configuring the data selector node to include a plurality of buffers that temporally align a plurality of incoming data signals and a plurality of predicate signals.

10. The method of claim 1, wherein configuring the current basic block further comprises configuring each of the current basic block and the respective previous basic blocks to have at most two fan-ins and two fan-outs.

11. A programmable integrated circuit device configured using a high-level language, the device comprising a plurality of hardware circuits representative of a virtual fabric having a plurality of basic blocks comprising pre-compiled combinations of logic elements that perform specific operations, wherein a flow within the virtual fabric between the basic blocks is configured at runtime, wherein each basic block comprises:
a branch selector node configured to, at runtime:
receive at least one control signal, wherein each of the at least one control signal is associated with a respective previous basic block; and select one of the at least one control signal based on one or more intended destinations for the at least one control signal; and a data selector node configured to:
receive the selected control signal from the branch selector node; and
select a data signal based on the selected control signal, wherein the selected data signal is from the respective previous basic block that is associated with the selected control signal.

12. The programmable integrated circuit device of claim 11, wherein each of the at least one control signal is received from a respective logic node in the respective previous basic block.

13. The programmable integrated circuit device of claim 11, wherein at least one of the branch selector node and the data selector node comprises one or more multiplexers.

14. The programmable integrated circuit device of claim 11, wherein the selected data signal is a variable value.

15. The programmable integrated circuit device of claim 14, wherein the variable value is an index variable or a result variable for a loop.

16. The programmable integrated circuit device of claim 11, wherein the respective previous basic blocks provide completion signals that indicate when processing in each of the respective previous basic blocks is complete.

17. The programmable integrated circuit device of claim 11, wherein the one or more intended destinations for the at least one control signal are indicated using predicate signals.

18. The programmable integrated circuit device of claim 11, wherein data selector node selects the data signal by filtering a plurality of incoming data signals based on the selected control signal and a value of the selected control signal.

19. The programmable integrated circuit device of claim 11, wherein the data selector node includes a plurality of buffers configured to temporally align a plurality of incoming data signals and a plurality of predicate signals.

20. The programmable integrated circuit device of claim 11, wherein each of the plurality of basic blocks has at most two fan-ins and two fan-outs.

* * * * *